United States Patent [19]

Armand

[11] 4,034,312
[45] July 5, 1977

[54] MICROWAVE OSCILLATOR USING A TRANSIT TIME TRANSISTOR

[75] Inventor: Marc Armand, Paris, France

[73] Assignee: Thomson-CSF, Paris, France

[22] Filed: Mar. 26, 1976

[21] Appl. No.: 670,757

[30] Foreign Application Priority Data

Mar. 28, 1975 France .......................... 75.09920

[52] U.S. Cl. .................................. 331/96; 330/12; 330/56; 331/101; 331/117 D; 357/34; 357/57

[51] Int. Cl.² ...................... H03B 5/18; H03B 9/12; H03F 3/55; H03F 3/60

[58] Field of Search ................ 331/96, 97, 99, 101, 331/104, 107 R, 108 R, 117 D; 330/12, 37, 56

[56] References Cited

UNITED STATES PATENTS

| | | | |
|---|---|---|---|
| 3,699,475 | 10/1972 | Rogers | 331/117 D X |
| 3,946,336 | 3/1976 | Froom et al. | 331/107 R |

OTHER PUBLICATIONS

Wright, "Efficiency of the Transistor Transit-Time Oscillator," Electronics Letters, May 31, 1968, vol. 4, pp. 217–219.

*Primary Examiner*—Siegfried H. Grimm
*Attorney, Agent, or Firm*—Oblon, Fisher, Spivak, McClelland & Maier

[57] ABSTRACT

A microwave oscillator using a transit-time transistor structure with a space charge zone, is provided. The negative resistance introduced by the transit-time in the space charge zone is utilized in a circuit connected with emitter and collector, the base being direct-biased and not passing the high frequency. To avoid a short-circuiting by the parasitic base-collector capacitance, a transmission line is connected in parallel across the base and collector terminals. The input impedance of this line is adjusted by short-circuiting this line at a distance close to a quarter of wavelength, thus creating an input inductance able to compensate the effect of the base-collector capacitance.

10 Claims, 8 Drawing Figures

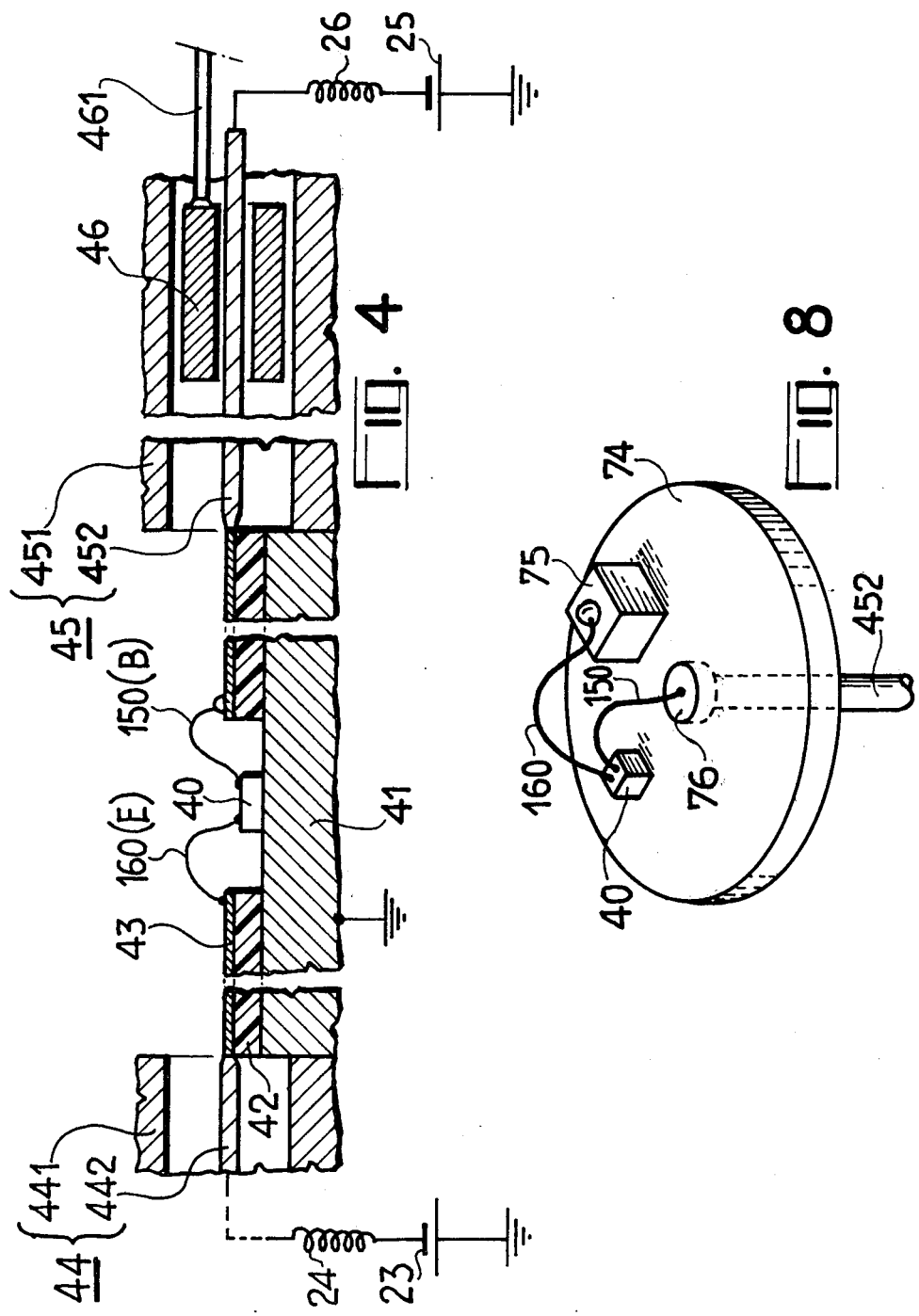

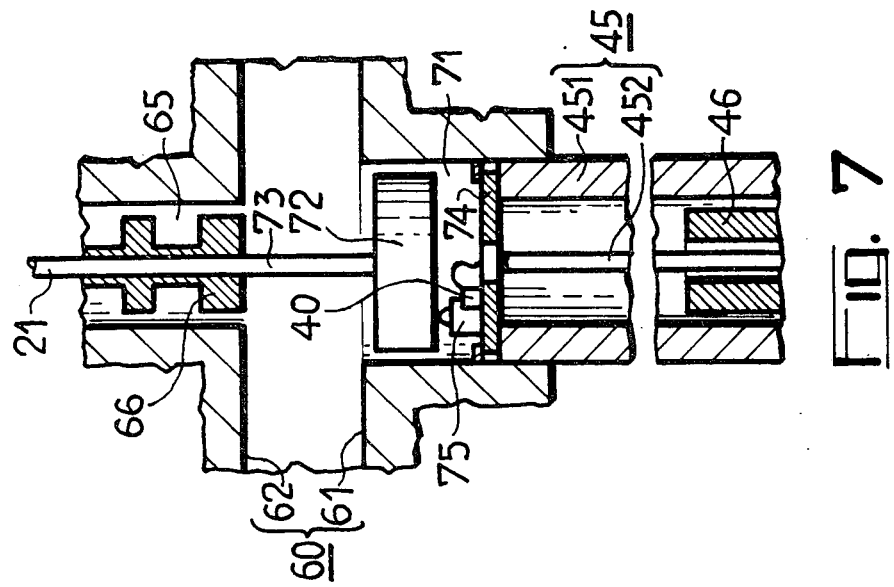
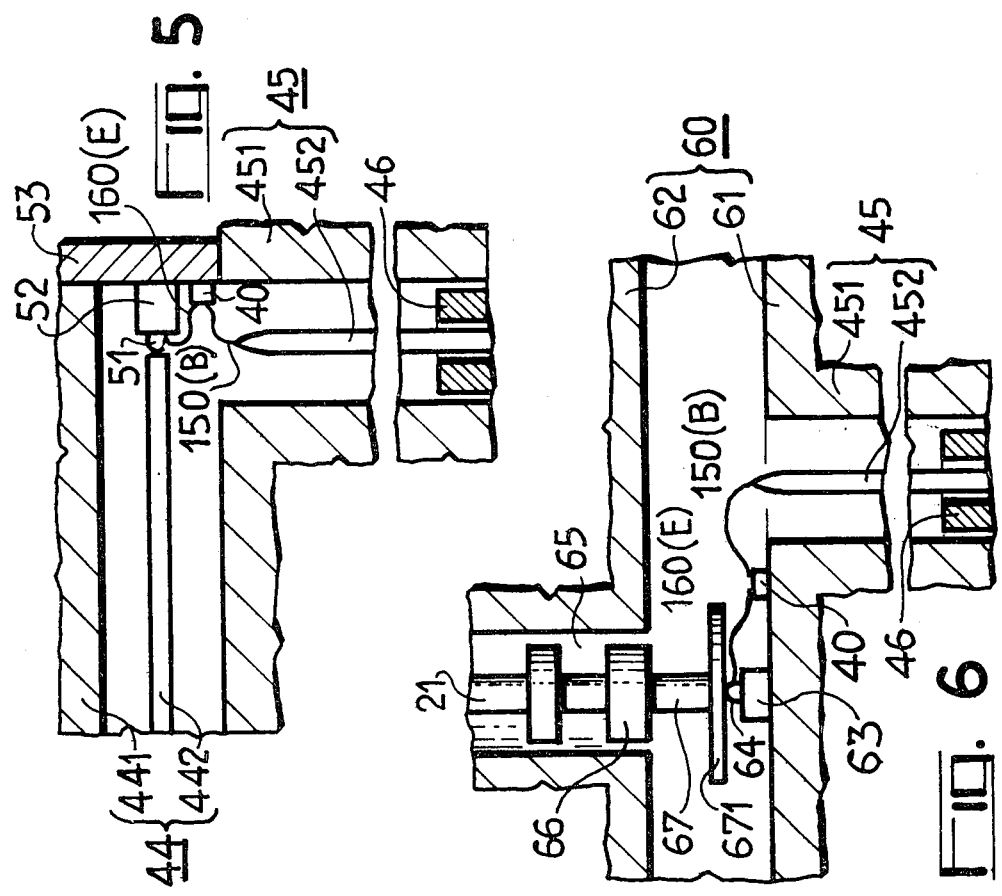

MICROWAVE OSCILLATOR USING A TRANSIT TIME TRANSISTOR

BACKGROUND OF THE INVENTION

The development of devices utilising transit time effects, has made it possible to considerably extend the range of frequencies which can be directly generated by semi-conductor devices. This increased range is due to the exploiting of the negative resistance arising out of the transit angle of the charge carriers in the semiconductor, when said angle is of the order of 180° C.

Those skilled in the art will be aware that if we called $\tau$ the transit time of the charge carriers, the possibilities as far as an increase in the frequency $f$ of a two-terminal transistor of conventional design, is concerned, are limited by the condition:

$$2\pi f \tau < 2\pi \qquad (1)$$

where the first member of the out of balance equation (1) represents the transit angle. However, it has been pointed out that if the transit angle is of the order of $\pi$, the reversal of the phase of the injected current could be used, in the case of the transistor. However the phase shift introduced by the base is accompanied by substantial attenuation. As a consequence the negative resistance would be low and could be masked by various parasitic elements.

It has been proposed (structure by G. T. WRIGHT" Electronics Letters"June 1967, vol. 3 No. 6, page 234) that the delay introduced by the base should be combined with a delay introduced by a space charge zone in a region extending from the base to the collector, in which zone the charge carriers move at a limiting velocity, namely the saturation drift velocity. In this case, the semi-conductor structure is again of the "transistor" type, with a delay of the order of $\pi/2$ introduced by the base and a delay of the order of $\pi$ by the space charge zone. Calculations carried out in relation to this structure show that a substantially higher negative resistance can be achieved than is possible in the absence of this zone. Moreover, the thickness of the space charge zone makes it possible to utilise a weaker electric field so that the power can be increased without breakdown occurring. In fact, it is the negative resistance between emitter and collector which is used, the base being direct biased and not passing the high frequency. In practice, however, the parasitic "base-collector" capacitance considerably disturbs the operation of the device, by short-circuiting it.

The invention overcomes this drawback.

BRIEF SUMMARY OF THE INVENTION

According to the invention, there is provided a device utilizing transit time effects, comprising:
a semiconductor structure of the transistor type with emitter, base and collector terminals, able to generate a high frequency oscillation at a predetermined frequency, by applying of a direct current voltage across emitter and collector terminals;
a transmission line of adjustable length having its input across said base and collector terminals and its output shortcircuited at high frequency, said adjustable length being able to vary on both sides of a value equal to a quarter of wavelength at said predetermined frequency.

BRIEF DESCRIPTION OF THE DRAWINGS

The invention will be better understood and other of its features rendered apparent, from a consideration of the ensuing description and the related drawings in which:

FIGS. 4, 5, 6 and 7 illustrate embodiments of the invention;

FIG. 8 illustrates a design detail of the device shown in FIG. 7.

DESCRIPTION OF THE PREFERRED EMBODIMENTS

Figure 1:
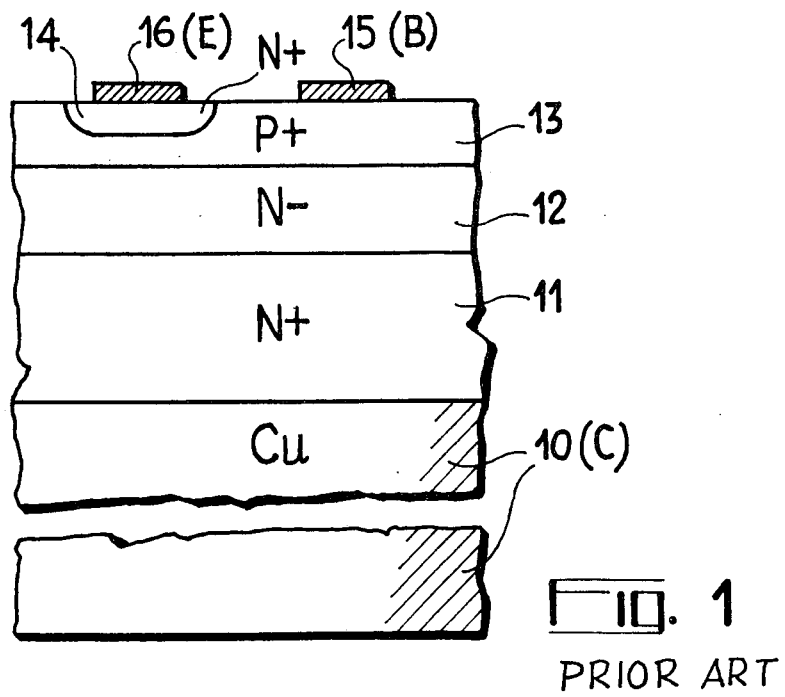
FIGS. 1 and 2, pertaining to the prior art, illustrate a section through a semiconductor structure and its connection as a transit-time transistor oscillator.

FIG. 1 illustrates in section a portion of a transittime transistor. To a copper base 10 constituting an ohmic contact for the collector, there is attached a substrate 11 of silicon which is highly N (N$^+$) doped. Upon this substrate there have been deposited epitaxially, a silicon layer of low N (N$^-$) level, containing for example $2.10^{14}$ atoms/cm$^3$ of N-type impurities, and then a layer 13 of high P (P$^+$) doping level Into this layer, from the free surface, in a region 14, N-type impurities have been diffused in order to obtain a high (N$^+$) doping level.

The layer 13 and the region 14 constitute the base and emitter of the transistor, respectively. Ohmic contacts 15 (B) and 16 (E) constituting the "base" and "emitter" terminals are implanted respectively at the free surface of the base and of the emitter. It should be borne in mind that in practice, in order to avoid disuniformities in the "collector" current, the region 14 is given the form of a comb with several teeth upon which a contact 16 of the same shape is implanted. The contact 15 is then implanted in the form of a comb structure whose teeth are interleaved with the aforementioned comb structure.

Figure 2:
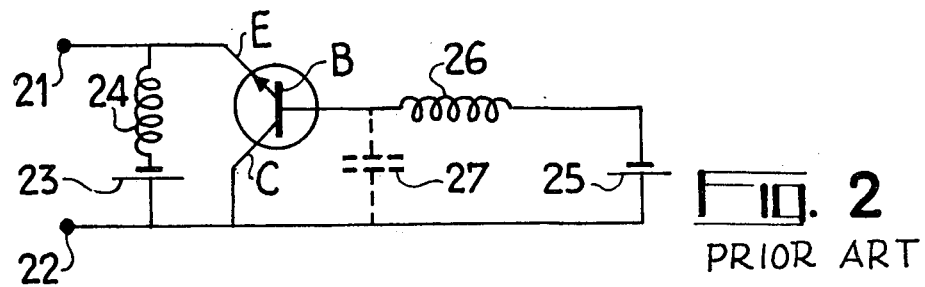

In the arrangement shown in FIG. 2, a direct voltage (source 23) is applied across a surge coil 24 between the emitter E and the collector C of a transistor similar to that of FIG. 1. Bias (source 25) is applied to the base across a surge coil 26. The "base-collector" capacitance 27 has been shown in broken line. Those skilled in the art will appreciate that high frequency amplification is possible between the terminals 21 and 22 due to the negative resistance existing between emitter and collector. The amplifier efficiency, however, is poor by reason of the presence of the parasitic capacitance 27 which short-circuits the negative resistance.

One end of a transmission line (a two-wire transmission line or some other type of line) is connected across base and collector terminals. The other end of the line is shortcircuited at high frequencies at a variable distance from the transistor, by a device symbolically marked 31 in FIG. 3. Elements already illustrated have been designated by the same references used in FIG. 2, whilst the resistance R$_{bb1}$ is added, this, with the capacitance 27, representing the equivalent of the base-collector impedance. Those skilled in the art will appreciate that for a length equal to a quarter of a wavelength at the frequency of oscillation, a line terminated in zero impedance at high frequency has an infinite impedance at its input. If the length of the line is less than a quarter of a wavelength, the input impedance will be inductive in nature. If a capacitor of low capacitance is connected between the input terminals of the line, as is the case in the arrangement in FIG. 3, it is possible, by manipulating the length of the line, to obtain resonance between inductance and capacitance and consequently to eliminate the unwanted effect of the base-collector capacitance.

A first embodiment, shown in FIG. 4, comprises a line element of the "microstrip" arranged between two coaxial lines. The microstrip line comprises, upon a conductive rail 41 of copper for example doing duty as earth conductor and mechanical support, an insulating strip 42 upon which there is deposited a strip 43 of conductive metal doing duty as the line conductor. The strips 42 and 43 are interrupted in order to leave a gap in which the copper base of a transistor 40 of the kind described earlier, can be soldered to the rail 41. connecting wires, of gold for example, are welded by thermocompression to the emitter and base contacts; these are the wires 160 (E) and 150 (B) linking the electrodes to the axial conductors of the coaxial lines 44 and 45 whose peripheral conductors 441 and 451 are cut out of blocks soldered to the ends of the rail 41. The source 23, across the surge coil 24, supplies the emitter via 442 and the source 25, across the surge coil 26, biases the base via an axial conductor 452. At the base end of the coaxial line 45 there is a sliding piston 46 of conductive metal, occupying a substantial length of the coaxial line and equipped with a control rod 461 to displace it. The piston is electrically insulated either from the earth 451 or from the axial conductor 452, by a safety gap so that the high-frequency short-circuit can be produced without metal-to-metal contact. It goes without saying that the microstrip portion of the transmission line must be substantially shorter than a quarter of a wavelength.

In a first variant embodiment shown in FIG. 5, the coaxial lines 44 and 45 are connected at right angles without the interposition of the microstrip line. The end of the line 45 opens on to a lateral opening in the peripheral conductor 441, the central conductor 442 being cut at the theoretical point of intersection of the axes of the two lines. At this location, there is a solder bead 51 stuck to one face of a parallelepiped block 52 of alumina itself stuck to the metal base 53 closing off the line 44. The transistor 40 is soldered to this base by its copper base. The connecting wires 150 and 160 (soldered to the bead 51) respectively link the base and emitter to each end of the central conductor.

Figure 3:
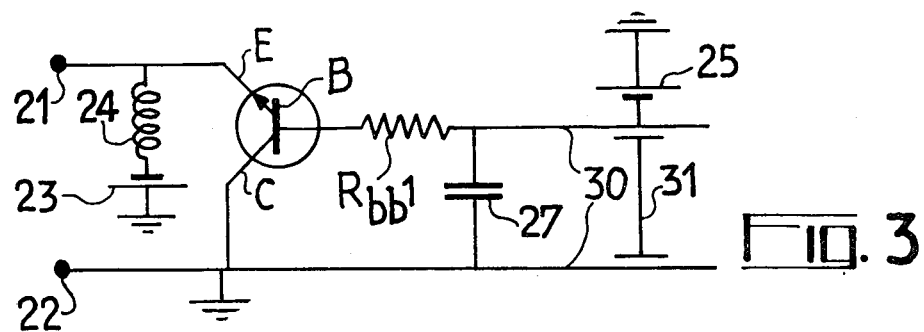
FIG. 3 is an equivalent diagram of a device in accordance with the invention.

In a second variant embodiment shown in FIG. 6, the line 44 is replaced by a rectangular waveguide 60. To one wall 61 of this waveguide the copper base of the transistor 40 has been soldered and a parallelepiped block 63 of alumina carrying a solder bead 64. Into the wall 62 opposite that 61, there opens out a cylinder 65 in which there slides the piston 66 of a disc matching device 67 whose disc 671 comes up against the bead 64. The emitter terminal 21 of the device shown in FIG. 3 is located at the free end of the rod carried by the piston 46. Into the wall 61 there opens out in the neighborhood of the transistor 40 a coaxial line 45 similar to that of FIGS. 4 and 5 and comprising in particular a piston 46.

In a third embodiment shown in FIG. 7, we once again encounter a waveguide 60 of rectangular cross-section, a cylinder 65 opening into a wall 62 and a coaxial line opening into the opposite wall 61. Here, however, the axis of the line 45 is located in extension of the axis of the cylinder 65. Moreover, a cylindrical chamber 71 is formed between the wall 61 and the commencement of the line 45. The piston 66 sliding in the cylinder 65, is traversed by a control rod 73 fixed to a piston 72 entering the chamber 71. At the base of said chamber, there is a metallised alumina washer 74 carrying the transistor 40 and a parallepiped alumina block 75. FIG. 8 illustrates an enlarged perspective view of the washer 74 and the components which it carries This washer is traversed centrally by a copper rod 76 linking the base lead 150 to the central conductor 452. The transistor 40 is soldered by its copper base to the washer 74 which constitutes the metallised base of the chamber 71.

In all the variant embodiments, the length of the transmission line can be varied by a whole number of half wavelengths, the input impedance being unmodified under these conditions.

The design of amplifiers and microwave generators using the device in accordance with the invention will be easy. It should perhaps be emphasised, however, that:

in the first case the amplification occurs between the terminals 21 and 22 of the arrangement of FIG. 1, due to the appearance of a negative resistance. This negative resistance appears between the conductors of the coaxial cable 44 shown in FIGS. 4 and 5; as far as the waveguide 60 is concerned, shown in FIGS. 6 and 7, the waveguide is terminated at one end by a mobile piston (not shown) and amplification is obtained by input to the waveguide at the other end;

in the second case, the same procedure adopted as for amplification is followed, then the parameters which give rise to the negative resistance (supply voltage or current, loading on line or waveguide) are modified until the reflection coefficient becomes negative (whilst being greater than unity in absolute value), this causing the system to oscillate.

What is claimed as new and desired to be secured by letters patent of the United States is:

1. A device utilizing transit time effects, comprising:
a semiconductor structure of the transistor type with emitter, base and collector terminals, able to generate a high frequency oscillation at a predetermined frequency, by applying of a direct current voltage across emitter and collector terminals;
a transmission line of adjustable length having its input across said base and collector terminals and its output short-circuited at high frequency said adjustable length being able to vary on both sides of a value equal to a quarter of wavelength at said predetermined frequency.

2. A device as claimed in claim 1, wherein said output is constituted by a coaxial line element comprising a metal conductive piston sliding in the gap between its axis and its periphery.

3. A device as claimed in claim 2, wherein said semiconductor structure is located at the end of a coaxial line section whose peripheral conductor is connected to the peripheral conductor of said coaxial line element, and whose central conductor is interrupted to enable, the emitter-base space of said structure to be inserted there, the collector of said structure being connected with said peripheral conductors.

4. A device as claimed in claim 3, wherein the axis of said section is perpendicular to the axis of said element.

5. A device as claimed in claim 2, wherein said input comprises a section of microstrip line whose earth and line conductors are respectively connected to the peripheral conductor and to the central conductor of the coaxial line element.

6. A device as claimed in claim 5, wherein said microstrip line section is extended at the emitter end by an additional microstrip line section.

7. A device as claimed in claim 6, wherein said additional microstrip line section is connected to an additional coaxial line section.

8. A device as claimed in claim 2, wherein said structure is located in a waveguide into which said coaxial line element opens and a disc matching device.

9. A device as claimed in claim 2, wherein said structure is located in a chamber formed in the wall of a waveguide in order to match said waveguide to said coaxial line element.

10. A device as claimed in claim 9, wherein the emitter contact of said structure is connected to a piston sliding in said chamber and operable by means of a rod passing through a cylinder opening into the wall opposite to said chamber.

* * * * *